US010043261B2

(12) United States Patent
Bhaskar et al.

(10) Patent No.: US 10,043,261 B2
(45) Date of Patent: Aug. 7, 2018

(54) GENERATING SIMULATED OUTPUT FOR A SPECIMEN

(71) Applicant: KLA-Tencor Corporation, Milpitas, CA (US)

(72) Inventors: Kris Bhaskar, San Jose, CA (US); Jing Zhang, Santa Clara, CA (US); Grace Hsiu-Ling Chen, Los Gatos, CA (US); Ashok Kulkarni, San Jose, CA (US); Laurent Karsenti, Rehovot (IL)

(73) Assignee: KLA-Tencor Corp., Milpitas, CA (US)

( * ) Notice: Subject to any disclaimer, the term of this patent is extended or adjusted under 35 U.S.C. 154(b) by 35 days.

(21) Appl. No.: 15/402,094

(22) Filed: Jan. 9, 2017

(65) Prior Publication Data

US 2017/0200265 A1    Jul. 13, 2017

Related U.S. Application Data

(60) Provisional application No. 62/277,321, filed on Jan. 11, 2016.

(51) Int. Cl.
*G06K 9/00* (2006.01)
*G06T 7/00* (2017.01)
(Continued)

(52) U.S. Cl.
CPC .............. *G06T 7/0006* (2013.01); *G03F 1/84* (2013.01); *G03F 1/86* (2013.01); *G03F 7/7065* (2013.01); *G06T 7/001* (2013.01); *G06T 7/0004* (2013.01); *G06T 2207/10061* (2013.01); *G06T 2207/20081* (2013.01); *G06T 2207/30148* (2013.01)

(58) Field of Classification Search
CPC ........... G06T 2207/30148; G06T 7/001; G06T 7/0006; G06T 7/0004
USPC .......... 382/141, 145, 147, 149, 152; 348/86, 348/125, 126
See application file for complete search history.

(56) References Cited

U.S. PATENT DOCUMENTS 6,902,855 B2    6/2005  Peterson et al.
7,418,124 B2    8/2008  Peterson et al.
(Continued)

OTHER PUBLICATIONS

Basak et al., "Support Vector Regression," Neural Information Processing—Letters and Reviews, vol. 11, No. 10, Oct. 2007, pp. 203-224.
(Continued)

*Primary Examiner* — Yosef Kassa
(74) *Attorney, Agent, or Firm* — Ann Marie Mewherter

(57) ABSTRACT

Methods and systems for generating simulated output for a specimen are provided. One method includes acquiring information for a specimen with one or more computer systems. The information includes at least one of an actual optical image of the specimen, an actual electron beam image of the specimen, and design data for the specimen. The method also includes inputting the information for the specimen into a learning based model. The learning based model is included in one or more components executed by the one or more computer systems. The learning based model is configured for mapping a triangular relationship between optical images, electron beam images, and design data, and the learning based model applies the triangular relationship to the input to thereby generate simulated images for the specimen.

28 Claims, 2 Drawing Sheets

(51) Int. Cl.
  *G03F 1/84* (2012.01)
  *G03F 1/86* (2012.01)
  *G03F 7/20* (2006.01)

(56) References Cited

U.S. PATENT DOCUMENTS

| | | | |
|---|---|---|---|
| 7,570,796 | B2 | 8/2009 | Zafar et al. |
| 7,676,077 | B2 * | 3/2010 | Kulkarni ............. G06F 17/5045 382/144 |
| 7,729,529 | B2 | 6/2010 | Wu et al. |
| 7,769,225 | B2 | 8/2010 | Kekare et al. |
| 8,041,106 | B2 | 10/2011 | Pak et al. |
| 8,073,240 | B2 * | 12/2011 | Fischer .................... G03F 1/84 382/145 |
| 8,111,900 | B2 | 2/2012 | Wu et al. |
| 8,126,255 | B2 * | 2/2012 | Bhaskar ................. G06T 7/001 382/141 |
| 8,213,704 | B2 | 7/2012 | Peterson et al. |
| 8,648,906 | B2 * | 2/2014 | Delaney ............. G01B 11/0608 348/128 |
| 8,664,594 | B1 | 4/2014 | Jiang et al. |
| 8,692,204 | B2 | 4/2014 | Kojima et al. |
| 8,698,093 | B1 | 4/2014 | Gubbens et al. |
| 8,716,662 | B1 | 5/2014 | MacDonald et al. |
| 8,775,101 | B2 * | 7/2014 | Huang ............... G01N 21/9501 702/40 |
| 9,092,846 | B2 * | 7/2015 | Wu ......................... G06T 7/001 |
| 9,171,364 | B2 * | 10/2015 | Wu ......................... G06T 7/001 |
| 9,218,531 | B2 | 12/2015 | Fukui et al. |
| 9,222,895 | B2 | 12/2015 | Duffy et al. |
| 2008/0167829 | A1 | 7/2008 | Park et al. |
| 2011/0276935 | A1 | 11/2011 | Fouquet et al. |
| 2011/0310388 | A1 | 12/2011 | Hill et al. |
| 2015/0179400 | A1 | 6/2015 | Lauber |
| 2015/0324965 | A1 | 11/2015 | Kulkarni et al. |
| 2016/0116420 | A1 | 4/2016 | Duffy et al. |
| 2017/0140524 | A1 | 5/2017 | Karsenti et al. |
| 2017/0148226 | A1 | 5/2017 | Zhang et al. |
| 2017/0193680 | A1 | 7/2017 | Zhang et al. |

OTHER PUBLICATIONS

Blei et al., "Variational Inference for Dirichlet Process Mixtures," Bayesian Analysis (2006), No. 1, pp. 121-144.

Damianou et al., "Deep Gaussian Processes," Proceedings of the International Conference on Artificial Intelligence and Statistics (AISTATS), 2013, 9 pages.

Goodfellow et al., "Generative Adversarial Nets," arXiv:1406.2661, Jun. 10, 2014, 9 pages.

Hand et al., "Principles of Data Mining (Adaptive Computation and Machine Learning)," MIT Press, 2001, 578 pages.

International Search Report and Written Opinion for PCT/US2017/012879 dated Apr. 28, 2017.

Jebara, "Discriminative, Generative, and Imitative Learning," MIT Thesis, 2002, 212 pages.

Kingma et al., "Semi-supervised Learning with Deep Generative Models," arXiv:1406.5298v2, Oct. 31, 2014, 9 pages.

Mirza et al., "Conditional Generative Adversarial Nets," arXiv:1411.1784, Nov. 6, 2014, 7 pages.

Orbanz et al., "Bayesian Nonparametric Models," 2010, 14 pages.

Ranzato et al., "Factored 3-Way Restricted Boltzmann Machines for Modeling Natural Images," Proceedings of the 13th International Conference on Artificial Intelligence and Statistics (AISTATS), 2010, Italy, 8 pages.

Ranzato et al., "Generating more realistic images using gated MRF's," NIPS'10 Proceedings of the 23rd International Conference on Neural Information Processing Systems, vol. 2, pp. 2002-2010, Vancouver, British Columbia, Canada, Dec. 2010.

Rasmussen et al., "Gaussian Processes for Machine Learning," (Chapter 5), the MIT Press, 2006, pp. 105-128.

Sugiyama, "Introduction to Statistical Machine Learning," Morgan Kaufmann, 2016, 534 pages.

U.S. Appl. No. 15/176,139 by Zhang et al. filed Jun. 7, 2016 (submitted as U.S. Patent Application Publication No. 2017/0148226 published May 25, 2017).

U.S. Appl. No. 15/353,210 by Bhaskar et al. filed Nov. 16, 2016 (submitted as U.S. Patent Application Publication No. 2017/0140524 published May 18, 2017).

U.S. Appl. No. 15/394,790 by Bhaskar et al. filed Dec. 29, 2016 (submitted as U.S. Patent Application Publication No. 2017/0193400 published Jul. 6, 2017).

U.S. Appl. No. 15/396,800 filed by Zhang et al. Jan. 2, 2017 (submitted as U.S. Patent Application Publication No. 2017/0193680 published Jul. 6, 2017).

* cited by examiner

GENERATING SIMULATED OUTPUT FOR A SPECIMEN

BACKGROUND OF THE INVENTION

1. Field of the Invention

The present invention generally relates to methods and systems for generating simulated output for a specimen using a learning based model that is configured for mapping a triangular relationship between optical images, electron beam images, and design data.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on specimens to drive higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

Defect review typically involves re-detecting defects detected as such by an inspection process and generating additional information about the defects at a higher resolution using either a high magnification optical system or a scanning electron microscope (SEM). Defect review is therefore performed at discrete locations on specimens where defects have been detected by inspection. The higher resolution data for the defects generated by defect review is more suitable for determining attributes of the defects such as profile, roughness, more accurate size information, etc.

Metrology processes are also used at various steps during a semiconductor manufacturing process to monitor and control the process. Metrology processes are different than inspection processes in that, unlike inspection processes in which defects are detected on specimens, metrology processes are used to measure one or more characteristics of the specimens that cannot be determined using currently used inspection tools. For example, metrology processes are used to measure one or more characteristics of specimens such as a dimension (e.g., line width, thickness, etc.) of features formed on the specimens during a process such that the performance of the process can be determined from the one or more characteristics. In addition, if the one or more characteristics of the specimens are unacceptable (e.g., out of a predetermined range for the characteristic(s)), the measurements of the one or more characteristics of the specimens may be used to alter one or more parameters of the process such that additional specimens manufactured by the process have acceptable characteristic(s).

Metrology processes are also different than defect review processes in that, unlike defect review processes in which defects that are detected by inspection are re-visited in defect review, metrology processes may be performed at locations at which no defect has been detected. In other words, unlike defect review, the locations at which a metrology process is performed on specimens may be independent of the results of an inspection process performed on the specimens. In particular, the locations at which a metrology process is performed may be selected independently of inspection results.

As described above, therefore, different information may be generated for a single specimen. This information may include design information for the specimen (i.e., information for a design of devices being formed on the specimen), optical image(s) generated for the specimen by one or more tools (e.g., an inspection tool), electron beam image(s) generated for the specimen by one or more tools (e.g., a defect review tool). It can sometimes be helpful to use a combination of different information to perform one or more processes on or for the specimen and/or to determine further information for the specimen. For example, it may be helpful to have optical and electron beam images corresponding to a single location within a design of a specimen to help diagnose a problem identified in that location within the design.

Using different types of information for a specimen in combination therefore requires some mapping of one type of information to another. Oftentimes, currently, such mapping may be performed by aligning different actual images generated for a specimen to each other (e.g., using alignment features in the images and/or on the specimen and/or aligning the different actual images to a common reference (e.g., design)). However, due to differences between the different types of information (e.g., different resolutions, pixel sizes, imaging methods (such as optical vs. electron beam), etc.), alignment of one type of information to another to establish a mapping between the different types of information can be relatively difficult and is susceptible to errors in the alignment method and/or algorithm and noise sources on the specimen (e.g., color variation). In addition, often, the different types of information that are used in combination must be generated separately and independently of each other. For example, in order to establish a relationship between optical and electron beam images for a specimen, the actual optical and electron beam images may need to be generated by imaging a physical version of the specimen. In addition, to establish a relationship between such images and design information for the specimen, the design information may be needed and may not always be available. Therefore, the currently used methods and systems for determining a mapping between different types of information for specimens such as reticles and wafers can be time consuming, expensive due to needing the specimen for actual imaging and imaging tools for generating the images, error prone due to the noise and other errors in the mapping itself, and even impossible when the design information is not available.

Accordingly, it would be advantageous to develop systems and methods for mapping different types of information for a specimen to each other that do not have one or more of the disadvantages described above.

SUMMARY OF THE INVENTION

The following description of various embodiments is n to be construed in any way as limiting the subject matter of the appended claims.

One embodiment relates to a system configured to generate simulated output for a specimen. The system includes one or more computer subsystems configured for acquiring information for a specimen. The information includes at least one of an actual optical image of the specimen, an actual electron beam image of the specimen, and design data for the specimen. The system also includes one or more components executed by the one or more computer subsystems. The one or more components include a learning based model that is configured for mapping a triangular relationship between optical images, electron beam images, and design data. The one or more computer subsystems are configured to input the information for the specimen into the learning based model, and the learning based model applies the triangular relationship to the input to thereby generate simulated output for the specimen. The system may be further configured as described herein.

Another embodiment relates to a computer-implemented method for generating simulated output for a specimen. The method includes acquiring information for a specimen with one or more computer systems. The information includes at least one of an actual optical image of the specimen, an actual electron beam image of the specimen, and design data for the specimen. The method also includes inputting the information for the specimen into a learning based model. The learning based model is included in one or more components executed by the one or more computer systems. The learning based model is configured for mapping a triangular relationship between optical images, electron beam images, and design data, and the learning based model applies the triangular relationship to the input to thereby generate simulated output for the specimen.

Each of the steps of the method described above may be further performed as described further herein. In addition, the embodiment of the method described above may include any other step(s) of any other method(s) described herein. Furthermore, the method described above may be performed by any of the systems described herein.

Another embodiment relates to a non-transitory computer-readable medium storing program instructions executable on one or more computer systems for performing a computer-implemented method for generating simulated output for a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those s ed in the art with the benefit of the following detailed description of the preferred embodiments and upon reference to the accompanying drawings in which.

Figure 1:
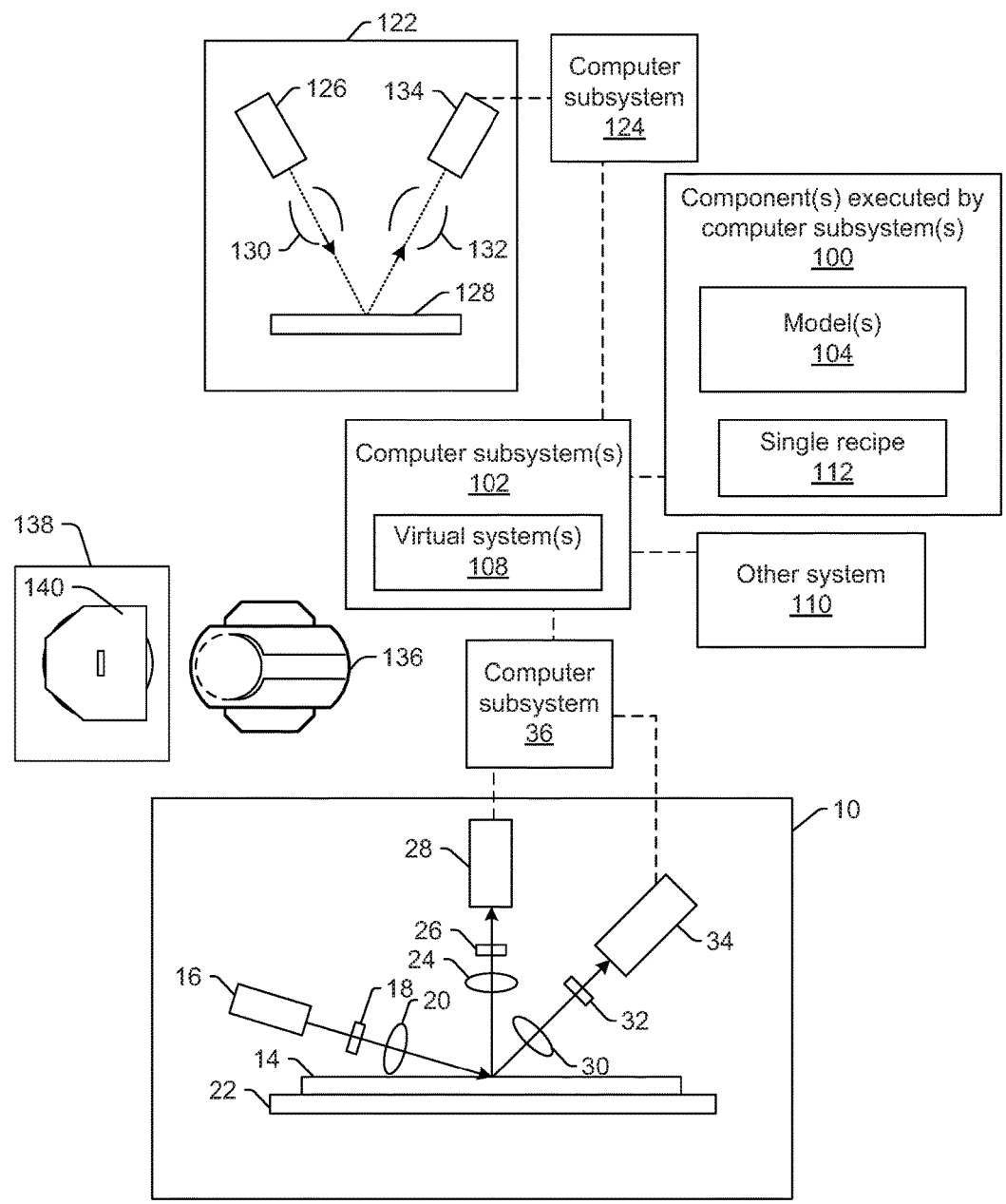
FIG. 1 is a schematic diagram illustrating a side view of an embodiment of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design," "design data," and "design information" as used interchangeably herein generally refer to the physical design (layout) of an and data derived from the physical design through complex simulation or simple geometric and Boolean operations. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In addition, the "design," "design data," and "design information" described herein refers to information and data that is generated by semiconductor device designers in a design process and is therefore available for use in the embodiments described herein well in advance of printing of the design on any physical specimens such as reticles and wafers.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured to generate simulated output for a specimen. One such embodiment is shown in FIG. 1. The system may include optical tool 10. In general, the optical tool is configured for generating optical images of a specimen by directing light to (or scanning light over) and detecting light from the specimen. In one embodiment, the specimen includes a wafer. The wafer may include any wafer known in the art. In another embodiment, the specimen includes a reticle. The reticle may include any reticle known in the art.

In the embodiment of the system shown in FIG. 1, optical tool 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to specimen 14 at an oblique angle of incidence. The oblique angle of incidence may include any suitable oblique angle of incidence, which may vary depending on, for instance, characteristics of the specimen.

The optical tool may be configured to direct the light to the specimen at different angles of incidence at different times. For example, the optical tool may be configured to alter one or more characteristics of one or more elements of the illumination subsystem such that the light can be directed to the specimen at an angle of incidence that is different than that shown in FIG. 1. In one such example, the optical tool may be configured to move light source 16, optical element 18, and lens 20 such that the light is directed to the specimen at a different oblique angle of incidence or a normal (or near normal) angle of incidence.

In some instances, the optical tool may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 18 may be configured as a spectral filter and the properties of the spectral fitter can be changed in a variety of different ways (e.g., by swapping out the spectral filter) such that different wavelengths of light can be directed to the specimen at different times. The illumination subsystem may have any other suitable configuration known in the art for directing the light having different or the same characteristics to the specimen at different or the same angles of incidence sequentially or simultaneously.

In one embodiment, light source 16 may include a broadband plasma (BBP) light source. In this manner, the light generated by the light source and directed to the specimen may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused onto specimen 14 by lens 20. Although lens 20 is shown in FIG. 1 as a single refractive optical element, it is to be understood that, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the optical tool may be configured to alter one or more of the elements of the illumination subsystem based on the type of illumination to be used for generating the optical images, The optical tool may also include a scanning subsystem configured to cause the light to be scanned over the specimen. For example, the optical tool may include stage 22 on which specimen 14 is disposed during optical imaging. The scanning subsystem may include any suitable mechanical and/or robotic assembly (that includes stage 22 ) that can be configured to move the specimen such that the light can be scanned over the specimen. In addition, or alternatively, the optical tool may be configured such that one or more optical elements of the optical tool perform sonic scanning of the light over the specimen. The light may be scanned over the specimen in any suitable fashion such as in a serpentine-like path or in a spiral path.

The optical tool further includes one or more detection channels. At least one of the one or more detection channels includes a detector configured to detect light from the specimen due to illumination of the specimen by the tool and to generate output responsive to the detected light. For example, the optical tool shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, both detection channels are configured to detect scattered light, and the detection channels are configured to detect light that is scattered at different angles from the specimen. However, one or more of the detection channels may be configured to detect another type of light from the specimen (e.g., reflected light).

As further shown in FIG. 1, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 30, element 32, and detector 34 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 1 shows an embodiment of the optical tool that includes two detection channels, the optical tool may include a different number of detection channels (e.g., only one detection channel or two or more detection channels). In one such instance, the detection channel formed by collector 30, element 32, and detector 34 may form one side channel as described above, and the optical tool may include an additional detection channel (not shown) formed as another side channel that is positioned on the opposite side of the plane of incidence. Therefore, the optical tool may include the detection channel that includes collector 24, element 26, and detector 28 and that is centered in the plane of incidence and configured to collect and detect light at scattering angle(s) that are at or close to normal to the specimen surface. This detection channel may therefore be commonly referred to as a "top" channel, and the optical tool may also include two or more side channels configured as described above. As such, the optical tool may include at least three channels (i.e., one top channel and two side channels), and each of the at least three channels has its own collector, each of which is configured to collect light at different scattering angles than each of the other collectors.

As described further above, each of the detection channels included in the optical tool may be configured to detect scattered light. Therefore, the optical tool shown in FIG. 1 may be configured for dark field (DF) imaging of specimens. However, the optical tool may also or alternatively include detection channel(s) that are configured for bright field (BF) imaging of specimens. In other words, the optical tool may include at least one detection channel that is configured to detect light specularly reflected from the specimen. Therefore, the optical tools described herein may be configured for only DF, only BF, or both DF and BF imaging. Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the ail. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical tool may be signals or data, but not image signals or image data. In such instances, a computer subsystem such as computer subsystem 36 may be configured to generate images of the specimen from the non-imaging output of the detectors. However, in other instances, the detectors may be configured as imaging detectors that are configured to generate imaging signals or image data. Therefore, the optical tool may be configured to generate optical images described herein in a number of ways.

It is noted that FIG. 1 is provided herein to generally illustrate a configuration of an optical tool that may be included in the system embodiments described herein or that may generate optical images that are used by the system embodiments described herein. Obviously, the optical tool configuration described herein may be altered to optimize the performance of the optical tool as is normally performed when designing a commercial optical tool. In addition, the systems described herein may be implemented using an existing system (e.g., by adding functionality described herein to an existing system) such as the 29xx/39xx and Puma 9xxx series of tools that are commercially available from KLA-Tencor, Milpitas, Calif. For some such systems, the embodiments described herein may be provided as optional functionality of the system (e.g., in addition to other functionality of the system). Alternatively, the optical tool described herein may be designed "from scratch" to provide a completely new optical tool.

Computer subsystem 36 coupled to the optical tool may be coupled to the detectors of the optical tool in any suitable mariner (e,g., via one or more transmission media, which may include "wired" and/or "wireless" transmission media) such that the computer subsystem can receive the output generated by the detectors for the specimen. Computer subsystem 36 may be configured to perform a number of functions described further herein using the output of the detectors.

The computer subsystems shown in FIG. 1 (as well as other computer subsystems described herein) may also be referred to herein as computer system(s). Each of the computer subsystem(s) or system(s) described herein may take various terms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer is platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 as shown by the dashed line in FIG. 1 by any suitable transmission media, which may include any suitable wired and/or wireless transmission media known in the art. Two or more of such computer subsystems may also be effectively coupled by a shared computer-readable storage medium (not shown).

The system may also include an electron beam tool configured for generating electron beam images of the specimen by directing electrons to (or scanning electrons over) and detecting electrons from the specimen. In one such embodiment shown in FIG. 1, the electron beam tool includes electron column 122, which may be coupled to computer subsystem 124.

As also shown in FIG. 1, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojitna et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1 as being configured such that the electrons are directed to the specimen at an oblique angle of incidence and are scattered from the specimen at another oblique angle, it is to be understood that the electron beam may be directed to and scattered from the specimen at any suitable angles. In addition, the electron beam tool may be configured to use multiple modes to generate electron beam images of the specimen as described further herein (e.g., with different illumination angles, collection angles, etc.). The multiple modes of the electron beam tool may be different in any imaging parameters of the electron beam tool.

Computer subsystem 124 may be coupled to detector 134 as described above. The detector may detect electrons returned from the surface of the specimen thereby forming electron beam output and/or images of the specimen. The electron beam output and/or images may include any suitable electron beam output and/or images. Computer subsystem 124 may be configured to perform one or more functions described further herein for the specimen using output generated by detector 134. Computer subsystem 124 may be configured to perform any additional step(s) described herein.

It is noted that FIG. 1 is provided herein to generally illustrate a configuration of an electron beam tool that may be included in the embodiments described herein. As with the optical tool described above, the electron beam tool configuration described herein may be altered to optimize the performance of the electron beam tool as is normally performed when designing a commercial electron beam tool. In addition, the systems described herein may be implemented using an existing system (e.g., by adding functionality described herein to an existing system) such as the eSxxx and eDR-xxxx series of tools that are commercially available from KLA-Tencor. For some such systems, the embodiments described herein may be provided as optional functionali the system (e.g., in addition to other functionality of the system). Alternatively, the system described herein may be designed "from scratch" to provide a completely new system.

In the embodiments described herein, the optical and electron beam tools may be coupled to each other in a variety of different ways. For example, in one embodiment, the optical tool and the electron beam tool are only coupled to each other via the one or more computer subsystems. In one such example, as shown in FIG. 1, optical tool 10 may be coupled to electron column 122 of the electron beam tool via only computer subsystem 36, computer subsystem(s) 102, and computer subsystem 124. Therefore, computer subsystem(s) 102 may be common to the optical tool and the electron beam tool. In this manner, the electron beam tool and the optical tool may not necessarily be directly connected to each other except for data movement, which may be massive and may be facilitated by computer subsystem(s) 102 and/or virtual system(s) 108. As such, the electron beam and optical tools may not be directly connected to each other except for data movement.

In another embodiment, the optical tool and the electron beam tool are only coupled to each other via the one or more computer subsystems and a common specimen handling subsystem. For example, the optical and electron beam based tools may be coupled by the computer subsystem(s) as described above. In addition, the optical tool and the electron beam tool may share common specimen handling system 136 and possibly load module 138, in which cassette 140 of specimens may be disposed. In this manner, specimens can come into a load module that is common to the optical and electron beam tools, where they can be disposed to either (or both) of an optical tool or an electron beam tool. The specimens can also be moved substantially quickly between the electron beam and optical tools.

In general, however, the optical tool may be coupled to the electron beam tool by a common housing (not shown), common specimen handling system 136, a common power source (not shown), computer subsystem(s) 102, or some combination thereof. The common housing may have any suitable configuration known in the art. For example, a housing may be configured to accommodate the optical tool as well as the electron beam tool. In this manner, the optical tool and the electron beam tool may be configured as a single unit or tool. The common specimen handling system may include any suitable mechanical and/or robotic assembly known in the art. The common specimen handling system may be configured to move the specimens between the optical tool and the electron beam tool in such a way that a specimen can be moved from the optical tool directly into the electron beam tool (or vice versa) without having to put the specimen back into its cassette or other container between the processes. The common power source may include any suitable power source known in the art.

The optical tool and the electron beam tool may be disposed laterally or vertically proximate to each other. For example, the system may be configured as a cluster of modules (or subsystems) that may each be configured to perform different processes. In addition, the optical tool and the electron beam tool may be disposed laterally or vertically proximate load module 138 of the system. The load module may be configured to support multiple specimens such as cassette 140 of wafers that are to be processed in the system. Robotic specimen handling system 136 may be configured to remove a specimen from the load module prior to measurement and/or inspection and to dispose a processed specimen into the load module. Furthermore, the optical tool and the electron beam tool may be disposed in other locations proximate each other such as anywhere a robotic common specimen handling system may fit such that a specimen may be moved between the tools% In this manner, common specimen handling system 136, a stage (not shown), or another suitable mechanical device may be configured to move a specimen to and from the optical tool and the electron beam tool.

The systems described herein may also include one or more additional tools configured to generate other output for the specimen such as an ion beam-based tool. Such a tool may be configured as shown in FIG. 1 with respect to the electron beam tool except that the electron beam source may be replaced with any suitable ion beam source known in the art. In addition, the tool may be any other suitable ion beam tool such as those included in commercially available focused ion beam (FIB) systems, helium ion microscopy (HIM) systems, and secondary ion mass spectroscopy (SIMS) systems.

The system also includes one or more computer subsystems, e.g., computer subsystem(s) 102 shown in FIG. 1, that are configured for receiving the actual optical.

images and the actual electron beam images generated for the specimen. For example, as shown in FIG. 1, computer subsystem(s) 102 may be coupled to computer subsystem 36 and computer subsystem 124 such that computer subsystem(s) 102 can receive the actual optical images or output generated by detectors 28 and 34 and actual electron beam images or output generated by detector 134. Although the computer subsystem(s) may receive the optical images or output and the electron beam images or output from other computer subsystems coupled to the optical and electron beam tools, the computer subsystem(s) may be configured to receive the optical and electron beam images or output directly from the detectors that generate the images or output (e.g., if computer subsystem(s) 102 are coupled directly to the detectors shown in Fig.

As noted above, the optical and electron beam tools may be configured for directing energy (e.g., light, electrons) to and/or scanning energy over a physical version of the specimen thereby generating actual (i.e., not simulated) output and/or images for the physical version of the specimen. In this manner, the optical and electron beam tools may be configured as "actual" tools, rather than "virtual" tools. Computer subsystem(s) 102 shown in FIG. 1 may, however, include one or more "virtual" systems 108 that are configured for performing one or more functions using at least sonic of the actual optical images and the actual electron beam images generated for the specimen, which may include any of the one or more functions described further herein.

The one or more virtual systems are not capable of having the specimen disposed therein. In particular, the virtual system(s) are not part of optical tool 10 or electron beam tool 122 and do not have any capability for handling the physical version of the specimen. In other words, in a system configured as a virtual system, the output of its one or more "detectors" may be output that was previously generated by one or more detectors of an actual tool and that is stored in the virtual system, and during the "imaging and/or scanning," the virtual system may replay the stored output as though the specimen is being imaged and/or scanned. In this manner, imaging and/or scanning the specimen with a virtual system may appear to be the same as though a physical specimen is being imaged and/or scanned with an actual system, while, in reality, the "imaging and/or scanning" involves simply replaying output for the specimen in the same manner as the specimen may be imaged and/or scanned.

Systems and methods configured as "virtual" inspection systems are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents. For example, the one or more computer subsystems described herein may be further configured as described in these patents.

As further noted above, the optical tool may be configured to generate output for the specimen with multiple modes. In this manner, in some embodiments, the actual optical images include images generated by the optical tool with two or more different values of a parameter of the optical tool. In general, a "mode" can be defined by the values of parameters of the optical tool used for generating output and/or images for a specimen. Therefore, modes that are different may be different in the values for at least one of the optical parameters of the tool. For example, in one embodiment of an optical tool, at least one of the multiple modes uses at least one wavelength of the light for illumination that is different from at least one wavelength of the light for illumination used for at least one other of the multiple modes. The modes may be different in the illumination wavelength as described further herein (e.g., by using different light sources, different spectral filters, etc.) for different modes. In another embodiment, at least one of the multiple modes uses an illumination channel of the optical tool that is different from an illumination channel of the optical tool used for at least one other of the multiple modes. For example, as noted above, the optical tool may include more than one illumination channel. As such, different illumination channels may be used for different triodes.

In a similar manner, the electron beam images may include images generated by the electron beam tool with two or more different values of a parameter of the electron beam tool. For example, the electron beam tool may be configured to generate output for the specimen with multiple modes. The multiple modes can be defined by the values of parameters of the electron beam tool used for generating output and/or images for a specimen. Therefore, modes that are different may be different in the values for at least one of the electron beam parameters of the tool. For example, in one embodiment of an electron beam tool, at least one of the multiple modes uses at least one angle of incidence for illumination that is different from at least one angle of incidence of the illumination used for at least one other of the multiple modes.

In some embodiments, the computer subsystem(s) are configured for receiving information for the specimen generated by another system, the computer subsystem(s) or the one or more virtual systems are configured for storing the information, and one or more functions described herein may be performed based on the stored information in combination with at least one of the actual optical image, the actual electron beam image, and the design data. For example, as shown in FIG. 1, computer subsystems) 102 may be coupled to other system 110 such that the computer subsystem(s) can receive information from the other system. The other system may include a variety of other systems such as an electronic design automation (EDA) tool, another computer system, which may be configured for a variety of different capabilities, a semiconductor fabrication tool, another inspection system, another quality control type system, etc. The information for the specimen may include a variety of information for the specimen such as information related to the design for the specimen, one or more fabrication processes performed on the specimen, one or more inspection, measurement, or other quality control processes performed on the specimen or another specimen of the same or different type, results of simulations generated for the specimen, information generated for the specimen from another source, etc. in this manner, the embodiments described herein can access and acquire a variety of prior information and reference data that can be used in a number of different steps described herein.

In one such example, the information from the other system may include information generated in a variety of ways such as by a process window qualification (PWQ) method, a design of experiments (DOE) that is performed empirically, simulations, pattern fidelity analysis (PFA), etc. Such information may also include reticle PWQ analysis. PWQ methods may be performed as described in U.S. Pat.

No. 6,902,855 to Peterson et al. issued on Jun. 7, 2005, U.S. Pat. No. 7,418,124 to Peterson et al. issued on Aug. 26, 2008, U.S. Pat. No. 7,729,529 to Wu et al. issued on Jun. 1, 2010, U.S. Pat. No. 7,769,225 to Kekare et al. issued on Aug. 3, 2010, U.S. Pat. No. 8,041,106 to Pak et al. issued on Oct. 18, 2011, U.S. Pat. No. 8,111,900 to Wu et al. issued on Feb. 7, 2012, and U.S. Pat. No. 8,213,704 to Peterson et al. issued on Jul. 3, 2012, which are incorporated by reference as if fully set forth herein. The embodiments described herein may include any step(s) of any method(s) described in these patents and may be further configured as described in these patents. A PWQ wafer may be printed as described in these patents.

In an additional such embodiment, the information may he generated by performing a process with two or more different values of one or more parameters of a process in a focus exposure matrix (FEM) method. For example, one strategy for generating information for a specimen is to use DOEs such as FEM methods and/or wafers as a generator of systematic defects. FEM methods generally involve printing a number of dies on a wafer at different combinations of focus and exposure parameter values of a lithography process. The different dies can then be imaged in any suitable manner to detect defects in the different dies. That information is then typically used to determine a process window for the focus and exposure of the lithography process. Therefore, a FEM method may be used to print such dies on a specimen, and the images for the different dies may be generated as described further herein.

Simulations of the specimens described herein may be performed with an empirically trained process model such as SEMulator 3D, which is commercially available from Coventor, Inc., Cary, N.C. An example of a rigorous lithography simulation model is Prolith, which is commercially available from KIA-Tencor, which can be used in concert with the SEMulator 3D product. However, the simulations may be performed with any suitable model of any of the processes) involved in producing actual specimens from design data. In this manner, a model may be used to simulate what a specimen on which a design has been formed will look like in specimen space (not necessarily what such a specimen would look like to a system such as an imaging or metrology system). Therefore, the output of the model may represent what, the specimens would look like in 2D or 3D space of the specimens, PFA may be performed as described in U.S. Patent Application Publication No. 2016/0116420 to Duffy et al. published on Apr. 28, 2016, which is incorporated by reference as if fully set forth herein. The embodiments described herein may be further configured as described in this publication.

In another example, the information from the other system may include signals to date generated for the specimen such as measurement, inspection, other yield related analysis, etc. The signals to date may also include results of edge placement error (EPE) analysis and/or predictive EPE (PEPE), which may be performed in any suitable manner known in the art. In this manner, the EPE analysis may include one or more empirical processes and/or one or more simulation processes.

In an additional example, the information from the other system may include design information for the specimen such as product information, design for inspection (DFI) information, target information, and design fusion information. Design fusion is a software development program targeting the transfer of critical design information from fabless customers into the fab for use by tools not owned or operated by the fabless customers. Such critical design information may include, for example, care areas for parts of the layout, timing critical nets, and the like. In some such examples, the other system may include an EDA tool. In this manner, the embodiments described herein may have an added dimension of leveraging data generated with EDA computer aided design (CAD) tools. The EDA tool may include any suitable commercially available EDA tool.

In a further example, the information from the other system may include standard reference images and/or information for noise sources on the specimen. The standard reference images may be generated in any suitable manner. The information for the noise sources may be generated in any suitable manner. The information from the other system may further include generated images. The generated images may be generated in any suitable manner such as by a model and/or another simulation model.

The specimens described herein may include a variety of different wafers such as nominal instances of the wafers and/or non-nominal instances of the wafers. "Nominal instances" as that term is used herein is generally defined as "instances" of specimens on which no defects are known to be present. For example, the specimen(s) that are nominal may be processed with one or more parameters of one or more processes, used to form a design on the specimen(s), that are known to generate non-defective specimens. In other words, the process(es) used to fabricate the specimen(s) may he known good process(es). In addition, the "nominal instances" of the specimens) may include instances (e.g., locations on specimens, whole specimens, etc.) at which no defects have been determined to be present. For example, the nominal instances of the specimen(s) may include locations and/or specimens at which an inspection or other quality control related process (e.g., defect review, metrology, etc.) has not detected any defects.

In contrast, "non-nominal instances" of the specimen(s) as that. term is used herein is generally defined as "instances" of the specimen(s) that are "defective" in some manner, either intentionally (via programmed or synthetic defects as described further herein) or unintentionally (via defects discovered on one or more specimens by inspection, defect review, metrology, etc.). In addition, it is noted that a specimen may be "defective" even if no "defects" per se are detected on the specimen. For example, a specimen may be considered "defective" if one or more measurements indicate that one or more characteristics of a design formed on the specimen are outside of a desired range of values for those one or more characteristics.

The specimens may also include product wafers (possibly with design for inspection (DFI) structures formed thereon) and/or characterization vehicles (i.e., electrical test structures)

The system includes one or more computer subsystems (e.g., computer subsystem(s) 36, 102, and 124 shown in FIG. 1) configured for acquiring information for a specimen. The information for the specimen includes at least one of an actual optical image of the specimen, an actual electron beam image of the specimen, and design data for the specimen. In the case of actual optical and/or electron beam images, the computer subsystem may be configured for acquiring the actual images by using one or more of the tools described herein for directing energy (e.g., light or electrons) to a specimen and detecting energy (e.g., light or electrons) from the specimen. Therefore, acquiring the actual images may include generating the images using a physical version of the specimen and some sort of imaging hardware. However, acquiring the actual images may include acquiring the actual images from a storage medium (including any of the storage media described herein) in which the actual images have been stored by an actual imaging system (e.g., optical tool 10). In addition, in the case of design data, the computer subsystem(s) may acquire the design data from a storage media or another system (e.g., system 110) or may generate the design data itself thereby acquiring the design data.

The system includes one or more components 100 executed by the one or more computer subsystems (e.g. computer subsystem(s) 102). The one or more components may be executed by the one or more computer subsystems in any suitable manner.

In one embodiment, the one or more components include a single recipe configured for controlling at least the optical tool and the electron beam tool. For example, as shown in FIG. 1, component(s) 100 may include single recipe 112. The single recipe may be essentially a super-recipe that includes conditional execution and loop triggering. The intent of a single recipe may be to insure self-consistency within the system operation flow (which is more complex than a conventional inspector). The main self-consistency issue in the embodiments described herein may be spatial (e.g., if you want to use images or output collected in multiple modes of a tool or multiple tools, each image or output acquisition has to be performed in the same location). There may also be reusable recipe components that capture the geometric information about the layout of the wafer and die etc. that can be applied throughout the super recipe, which could involve data collection from different tools. Today, this can be done manually. The proposed system may enforce this by considering the collection of recipes in aggregate (a super-recipe), rather than the conventional collection of separate recipes for the optical tool, one for the electron beam tool, etc.

The optical and electron beam tools described herein may be configured as inspection tools. In addition, or alternatively, the optical and electron beam tools described herein may be configured as defect review tools. Furthermore, the optical and electron beam tools described herein may be configured as metrology tools. In particular, the embodiments of the optical and electron beam tools described herein and shown in FIG. 1 may be modified in one or more parameters to provide different imaging capability depending on the application for which they will be used. In one such example, the optical tool shown in FIG. 1 may be configured to have a higher resolution if it is to be used for defect review or metrology rather than for inspection. In other words, the embodiments of the optical and electron beam tools shown in FIG. 1 describe some general and various configurations for optical and electron beam tools that can be tailored in a number of manners that will be obvious to one skilled in the art to produce imaging tools having different imaging capabilities that are more or less suitable for different applications.

Figure 2:
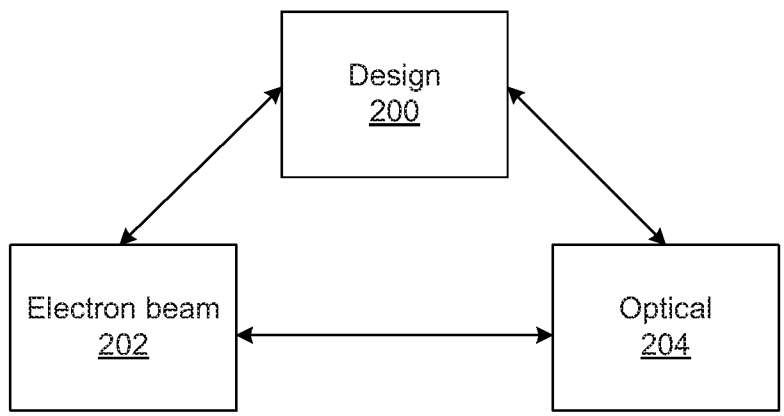
FIG. 2 is a block diagram illustrating the triangular mapping for which the learning based models described herein are configured.

The component(s), e.g., component(s) 100 shown in FIG. 1, executed by the computer subsystem(s), e.g., computer subsystem 36 and/or computer subsystem(s) 102, include learning based model 104. The learning based model is configured for mapping a triangular relationship between optical images, electron beam images, and design data. For example, as shown in FIG. 2, the learning based model may be configured for mapping a triangular relationship between three different spaces: design 200, electron beam 202, and optical 204. The embodiments described herein, therefore, provide a generalized representation mapping system between optical, electron beam, and design (e.g., CAD) for semiconductor wafers and masks for inspection, metrology, and other use cases. The embodiments described herein, therefore, also provide a systematic approach to perform transformations between different observable representations of specimens such as wafers and reticles in semiconductor process control applications. The representations include design data, EDA design, (with 0.1 nm placement accuracy), scanning electron microscopy (SEM) review/inspection/etc. (with 1 nm placement accuracy), and patch images from optical tools such as inspection (with 10 nm to 100 nm placement accuracy).

To the knowledge of the inventors, no automated system currently exists that attempts to map the triangular relationship between optical, electron beam, and design in such a principled and practical manner as proposed herein. Currently, relationships between different spaces may be established in a much different matter. For example, currently, outlier detection may be performed on an optical tool, which may be trained in a substantially sparse manner on a defect review tool, and then a relatively straightforward sampling algorithm may be used to select samples of detected outliers for review during production.

The currently used methods, therefore, have a number of disadvantages compared to the embodiments described herein. For example, no automated system exists which attempts to map the triangular relationship between optical, electron beam, and design. In addition, while attempts have been made to combine data from different modalities (such as wavelengths), these methods and systems tend to be crude and point estimates due to space and computing limitations. Furthermore, representation learning conditioning on one or more discrete or continuous process parameters cannot be simulated well by a single model. Moreover, on the optical side, color variation results in mapping of multiple optical images to the same electron beam image or design ground truth due to film thickness variations which is the most basic wafer process noise.

The one or more computer subsystems are configured to input the information for the specimen into the learning based model, and the learning based model applies the triangular relationship to the input to thereby generate simulated output for the specimen.

The computer subsystem(s) may be configured to input the information for the specimen into the learning based model in any suitable manner. The learning based model may include one or more of the different learning based models described herein. In addition, the learning based model may apply the triangular relationship to the input as described further herein. The simulated output may include a variety of output described further herein.

In general and as described further herein, given that semiconductor equipment systems include, but are not limited to, metrology, inspection, etch, deposition, patterning, etc., and semiconductor designing and/or simulating systems and/or algorithms from which different representations of a specimen may be collected from sensors and/or simulations, the embodiments described herein are configured for a general and automated implementation for the representation conversion between arbitrary subsets of representations. As described further herein, the collected representations may include, but are not limited to, optical, electron beam, design, simulation, etc. under different tool and/or simulation setups which include, but are not limited to, wavelength band(s), aperture(s), focus(es), polarization(s), electron beam size(s), field of view(s), etc.

The embodiments described herein may include or be configured for training and one or more inferences/predictions. The inference for representation learning may infer the hidden representation in mixtures of distributions including but not limited to Gaussian, t-distribution, etc. The inference for representation conversion may predict the desired representation from input representation in either a scalar value or a distribution including but not limited to Gaussian, t-distribution, etc. as described further herein. As also described further herein, the embodiments can predict optical and/or electron beam images under arbitrary imaging and process parameters. The parameters can be either discrete or continuous values. The training described further herein may or may not specify a valid value range for each parameter.

In one embodiment, the information that is input to the learning based model includes the actual optical image of the specimen, and the simulated output includes a simulated electron beam image representing an actual electron beam image generated for the specimen by an electron beam tool. For example, the embodiments described herein may be configured for performing transformations from any subset of representations to another subset of representations within the resolution limit, which may include transforming optical input to electron beam simulated output.

In another embodiment, the information that is input to the learning based model includes the actual optical image of the specimen, and the simulated output includes simulated design data for the specimen. For example, the embodiments described herein may be configured for performing transformations from any subset of representations to another subset of representations within the resolution limit, which may include transforming optical input to design simulated output.

In an additional embodiment, the information that is input to the learning based model includes the actual electron beam image of the specimen, and the simulated output includes simulated design data for the specimen. For example, the embodiments described herein may be configured for performing transformations from any subset of representations to another subset of representations within the resolution limit, which may include transforming electron beam input to design simulated output.

In some embodiments, the information for the specimen includes actual optical images of the specimen generated at different values of a parameter of an optical tool, and the information that is input to the learning based model includes the actual optical images of the specimen. For example, the optical (e.g., inspection) parameters may include wavelength, aperture, focus, etc. on an optical tool. In another embodiment, the information for the specimen includes actual electron beam images of the specimen generated at different values of a parameter of an electron beam tool, and the information that is input to the learning based model includes the actual electron beam images of the specimen. For example, the electron beam (e.g., inspection) parameters may include electron beam size, focus, energy level, etc. on an electron beam tool. The optical and electron beam images may also be generated for different values of a parameter of a process performed on a specimen. In general, the notation (p1, p2, . . . , pn) is used herein to represent a set of optical, electron beam, or process parameters, i.e., p1 is one set of parameters, p2 is a different set of parameters, and so on. These parameters can be recorded from an optical tool, an electron beam tool, or a process tool. For example, the images that are acquired may be associated with information for the parameters of the tool used to generate the images and/or the parameters of the process used to fabricate the portion of the specimen represented in the images.

An optical image stack (i.e., multiple optical images) is represented herein by the notation O(x, y, p1, p2, pn), which is the pixel value at (x, y) location observed on an optical tool under the optical and process parameters (p1, p2, . . . , pn). Similarly, an electron beam image stack (i.e., multiple electron beam images) is represented herein by the notation S(x, y, p1, p2, . . . , pn), which is the pixel value at (x, y) location observed on an electron beam tool under the electron beam and process parameters of (p1, p2, . . . , pn). Design information is represented herein by the notation D(x, y, l), which is the pixel value at (x, y) location of design information, e.g., a rendered design, for the 1-th wafer layer. Specimen features are represented herein by the notation W(x, y), which refers to certain features at (x, y) location of a specimen, e.g., defect class information, patterned features, electrical test results, etc. These features are either computable from subsets of design, optical images, and electron beam images via currently used algorithms or directly measureable from a semiconductor toot.

The learning based model may be configured to perform a representation transformation with fixed parameters. For example, given one or more of optical images, electron beam images, design, and/or features as input collected with a fixed set of parameters, the learning based model is expected to predict a subset of representations under a fixed set of the same or different parameters. Several such examples will now be described.

In some embodiments, the information for the specimen includes actual optical images of the specimen generated at different values of a parameter of an optical toot, the information that is input to the learning based model includes the actual optical images of the specimen, and the simulated output includes a simulated electron beam image of the specimen representing an actual electron beam image generated for the specimen by an electron beam tool. For example, given an optical image stack of O(x, y, focus={0, 1, 2, 3}) with focus discretely at 0, 1, 2, and 3, an electron beam image of S(x, y, normal beam) may be predicted by the learning based model.

In one embodiment, the information for the specimen includes actual optical images of the specimen generated at different values of a parameter of an optical toot, the information that is input to the learning based model includes the actual optical images of the specimen, the input to the learning based model includes another different value of the parameter of the optical tool, and the simulated output includes a simulated optical image of the specimen representing an optical image generated at the other different value of the parameter of the optical tool. For example, given an optical image stack of O(x, y, focus={0, 1, 2, 3}) with focus discretely at 0, 1, 2, and 3, the learning based model can predict an optical image at a fixed different focus=4, i.e., O(x, y, focus=4). In another example, given an optical image stack of O(x, y, focus={0, 1, 2, 3}) with focus discretely at 0, 1, 2, and 3, the learning based model may predict an optical image at a fixed different focus=1.5, i.e., O(x, y, focus=1.5).

In some embodiments, the information that is input to the learning based model includes the actual optical image of the specimen and the design data for the specimen, and the simulated output includes a simulated electron beam image for the specimen representing an actual electron beam image generated for the specimen by an electron beam tool. For example, given an optical image stack of O(x, y, focus=1) and design, the learning based model may predict an electron beam image of the specimen, e.g., S(x, y, normal beam).

In a further embodiment, the information for the specimen includes actual optical images of the specimen corresponding to different values of a parameter of a process performed on the specimen, the information that is input to the learning based model includes the actual optical images of the specimen, the input to the learning based model includes another different value of the parameter of the process, and the simulated output includes a simulated optical image of the specimen corresponding to the other different value of the parameter of the process. For example, given an optical image stack of O(x, y, process focus={−1, 0, 1}, process exposure {0, 1, 2}), the learning based model may predict an optical image at a fixed different process focus, e.g., 5, and exposure, e.g., 1.5, i.e., O(x, y, process focus=0.5, process exposure=1.5).

In an additional embodiment, the information for the specimen includes actual optical images of the specimen generated at different values of a parameter of an optical tool, the information that is input to the learning based model includes the actual optical images of the specimen and the design data for the specimen, and the simulated output includes defect classifications for defects detected on the specimen. For example, given an optical image stack of O(x, y, focus={0, 1, 2, 3}) with focus discretely at 0, 1, 2, and 3 and design of D(x, y, l=0), the learning based model may predict defect class code(s) at each pixel, i.e., W(x, y). Therefore, feature learning can also be included in the problem statement.

In one embodiment, the information that is input to the learning based model includes run time input, and the actual information for the run time input includes information for a pattern not included in input to the learning based model used for training the learning based model. In another embodiment, the learning based model is not configured for generating the simulated output for the specimen by performing pixel-value interpolation. In an additional embodiment, the learning based model is not configured for generating the simulated output for the specimen by performing pixel-value extrapolation. For example, the learning based model can perform predictions on a never seen input or patterns (an input or a pattern that is not in a training dataset). In other words, the learning based model is applicable to runtime inputs with new patterns, which are not included in training inputs. Therefore, the presentation transformation is neither a simple pixel-value interpolation nor pixel-value extrapolation problem. The learned model may only perform the prediction at the fixed, chosen representation with fixed, chosen parameters.

As described above, the learning based model may be configured to generate simulated output at a single predetermined imaging and/or process parameter. However, the learning based model may be configured to generate the simulated output at multiple predetermined imaging and/or process parameters. For example, the learning based model may be configured to generate simulated output as a function of imaging and/or process parameters. In particular, given one or more of optical images, electron beam images, design and/or features as input collected with a fixed set of parameters, the learning based model can learn the transformation to a subset of representations as a function of imaging and/or process parameters. In one such example, given an optical image stack of O(x, y, focus={0, 1, 2, 3}) with discrete focus values of 0, 1, 2, and 3, the learning based model may predict an optical image with arbitrary focus value, i.e., O(x, y, focus), where focus may be in the range of [−10, +10]. In another example, given an optical image stack of O(x, y, process focus={−1, 0, 1}, process exposure={0, 1, 2}) with discrete process focus and exposure values, the learning based model may predict optical images with arbitrary focus and exposure values.

In such embodiments, the learning based model does not generate the simulated output by pixel-value interpolation or pixel-value extrapolation. In addition, the learning based model can perform the prediction at fixed chosen representations with arbitrary parameters. The learning process may define the valid parameter range for each parameter to deal with extreme cases.

In one embodiment, the learning based model is configured for mapping a relationship between patterned features on the specimen and one or more of the optical images, the electron beam images, and the design data. For example, as described further herein, the specimen features may be defined as W(x, y) referring to certain features at (x, y) locations on a specimen. In this manner, as described further herein, given one or more of an optical image, an electron beam image, design, and/or features on a specimen as input collected with a fixed set of imaging and/or process parameters, the learning based models described herein can predict a subset of representations under the same or different parameters.

In another embodiment, the information for the specimen includes two or more actual optical images of the specimen, and the two or more actual optical images include two or more actual optical images corresponding to different values of a parameter of an optical tool, two or more actual optical images of a layer on the specimen generated before and after a process is performed on the specimen, two or more actual optical images of different physical layers on the specimen, two or more actual optical images of the specimen generated by different optical tools, two or more actual optical images of the specimen corresponding to different values of a parameter of a process performed on the specimen, or a combination thereof. For example, the embodiments described herein may be configured for data collection of a set of optical images. The optical images may have various sizes, e.g., the size of a patch image (or about 32 pixels by 32 pixels) to the size of a frame image (or about 1024 pixels by 1024 pixels), depending on the use case.

The optical images are preferably larger than the size of the optical tool's point spread function (PSF). The optical images may be collected from a source such as an optical inspection tool, a virtual inspector, or both. 1 n addition, the optical images may be stacked by: various positions in the z dimension through focus on the same physical layer, same physical layer between different processes (e.g., one layer before and after a lithography process performed on the specimen), different physical layers (e.g., different metal layers, i.e., metal 1 (M1), metal 2 (M2), etc., where different physical layers are formed either above or below one another on the specimen and include different patterned features), different optical parameters such as aperture, wavelength, polarization, etc,, different optical tools, different process parameters, e.g., focus and exposure, or any combination thereof.

In an additional embodiment, the information for the specimen includes two or more actual electron beam images of the specimen, and the two or more actual electron beam images include two or more actual electron beam images corresponding to different values of a parameter of an electron beam tool, two or more actual electron beam images of a layer on the specimen generated before and after a process is performed on the specimen, two or more actual electron beam images of different physical layers on the specimen, two or more actual electron beam images of the specimen generated by different electron beam tools, two or more actual electron beam images of the specimen corresponding to different values of a parameter of a process performed on the specimen, or a combination thereof. For example, the embodiments described herein may be configured for data collection of a set of electron beam images. The size of the electron beam images may be any possible electron beam image size from an electron beam tool. The source of the electron beam images may be an electron beam tool, a virtual inspector, or both. The electron beam images may be stacked by: various positions in the z dimension through focus on the same physical layer, same physical layer between different processes (e.g., one layer on a specimen before and after an etch process is performed on the specimen), different physical layers (such as those described further above), different electron beam tool conditions, different electron beam tool channels from separate detectors, different electron beam tools, different process parameters, e.g. focus and exposure, or any combination thereof.

In some embodiments, the design data for the specimen includes the design data stacked by: different selected patterns in the same layer, different layers, different materials, or a combination thereof. For example, the embodiments described herein may be configured for data collection of design (e.g., CAD). The size of the design may be use case dependent. The source for the design may be IC design CAD files. The design may be stacked by (3D matrix per sample): different selected patterns in the same layer, different layers, different materials, or some combination thereof.

In one embodiment, the information for the specimen includes information for patterned features formed on the specimen, and the information for the patterned features is generated experimentally or theoretically. For example, the embodiments described herein may be configured for data collection of feature images or data. The size of the feature images or data may be use case dependent. The source of the feature images or data may include features or data generated from process applications, e.g., PWQ, which may be performed as described further herein, FEM, which may be performed as described further herein, user input from a process engineer, etc. The source of the feature images or data may also include commercially available image processing or signal processing algorithms (e.g., SEM ADC algorithm(s), SEM contour algorithm(s), optical phase retrieval algorithm(s), etc.). Another source of the feature images and/or data includes process conditions and/or parameters. The feature images and/or data may be stacked by different features, different sources such as those described above, and any combination thereof.

Data collection performed by the embodiments described herein may also include some combination of the data described above (e.g., some combination of optical images, electron beam images, design, and feature images or data).

The learning based models described herein may be deep learning models. Generally speaking, "deep learning" (also known as deep structured learning, hierarchical learning or deep machine learning) is a branch of machine learning based on a set of algorithms that attempt to model high level abstractions in data. In a simple case, there may be two sets of neurons: ones that receive an input signal and ones that send an output signal. When the input layer receives an input, it passes on a modified version of the input to the next layer. In a deep network, there are many layers between the input and output (and the layers are not made of neurons but it can help to think of it that way), allowing the algorithm to use multiple processing layers, composed of multiple linear and non-linear transformations.

Deep learning is part of a broader family of machine learning methods based on learning representations of data. An observation (e.g., an image) can be represented in many ways such as a vector of intensity values per pixel, or in a more abstract way as a set of edges, regions of particular shape, etc. Some representations are better than others at simplifying the learning task (e.g., face recognition or facial expression recognition). One of the promises of deep learning is replacing handcrafted features with efficient algorithms for unsupervised or semi-supervised feature learning and hierarchical feature extraction.

Research in this area attempts to make better representations and create models to learn these representations from large-scale unlabeled data. Some of the representations are inspired by advances in neuroscience and are loosely based on interpretation of information processing and communication patterns in a nervous system, such as neural coding which attempts to define a relationship between various stimuli and associated neuronal responses in the brain.

Various deep learning architectures such as deep neural networks, convolutional deep neural networks, deep belief networks and recurrent neural networks have been applied to fields like computer vision, automatic speech recognition, natural language processing, audio recognition and bioinformatics where they have been shown to produce state-of-the-art results on various tasks.

The learning based models may also include machine learning models. Machine learning can be generally defined as a type of artificial intelligence (AI) that provides computers with the ability to learn without being explicitly programmed. Machine learning focuses on the development of computer programs that can teach themselves to grow and change when exposed to new data. In other words, machine learning can be defined as the subfield of computer science that "gives computers the ability to learn without being explicitly programmed," Machine learning explores the study and construction of algorithms that can learn from and make predictions on data—such algorithms overcome following strictly static program instructions by making data driven predictions or decisions, through building a model from sample inputs.

The machine learning described herein may be further performed as described in "Introduction to Statistical Machine Learning," by Sugiyama, Morgan Kaufmann, 2016, 534 pages; "Discriminative, Generative, and Imitative Learning," Jebara, MIT Thesis, 2002, 212 pages; and "Principles of Data Mining (Adaptive Computation and Machine Learning)," Hand et al., MIT Press, 2001, 578 pages; which are incorporated by reference as if fully set forth herein. The embodiments described herein may be further configured as described in these references, In another embodiment, the learning based model includes a discriminative model. For example, for learning a transformation under fixed imaging or process parameters as described above, the learning based model may be configured for a discriminative approach. Discriminative models, also called conditional models, are a class of models used in machine learning for modeling the dependence of an unobserved variable y on an observed variable x. Within a probabilistic framework, this is done by modeling the conditional probability distribution $P(y\mid x)$, which can be used for predicting y from x. Discriminative models, as opposed to generative models, do not allow one to generate samples from the joint distribution of x and y. However, for tasks such as classification and regression that do not require the joint distribution, discriminative models can yield superior performance. On the other hand, generative models are typically more flexible than discriminative models in expressing dependencies in complex learning tasks. In addition, most discriminative models are inherently supervised and cannot easily be extended to unsupervised learning. Application specific details ultimately dictate the suitability of selecting a discriminative versus generative model.

In one such embodiment, the discriminative model includes a support vector machine, a support vector regression, a convolutional neural network, or a recurrent neural network. For example, learning a transformation under a fixed set of inspection and/or process parameters can be solved as a regression problem or classification problem via a discriminative approach and the possible models include support vector machine, support vector regression, a convolutional neural network (CNN), and a recurrent neural network (RNN).

In machine learning, support vector machines (SVMs, also support vector networks) are supervised learning models with associated learning algorithms that analyze data used for classification and regression analysis. Given a set of training examples, each marked as belonging to one or the other of two categories, an SVM training algorithm builds a model that assigns new examples to one category or the other, making it a non-probabilistic binary linear classifier. An SVM model is a representation of the examples as points in space, mapped so that the examples of the separate categories are divided by a clear gap that is as wide as possible. New examples are then mapped into that same space and predicted to belong to a category based on which side of the gap they fall.

In addition to performing linear classification, SVMs can efficiently perform a non-linear classification using What is called the kernel trick, implicitly mapping their inputs into high-dimensional feature spaces.

When data are not labeled, supervised learning is not possible, and an unsupervised learning approach is required, which attempts to find natural clustering of the data to groups, and then map new data to these formed groups. The clustering algorithm which provides an improvement to the support vector machines is called support vector clustering and is often used in industrial applications either when data are not labeled or when only some data are labeled as a preprocessing for a classification pass.

As described in "Support Vector Regression," by Basak et al., Neural Information Processing—Letters and Reviews, Vol. 11, No. 10, October 2007, pp. 203-224, which is incorporated by reference as if fully set forth herein, instead of minimizing the observed training error, Support Vector Regression (SVR) attempts to minimize the generalization error bound so as to achieve generalized performance. The idea of SVR is based on the computation of a linear regression function in a high dimensional feature space where the input data are mapped via a nonlinear function. SVR has been applied in various fields—time series and financial (noisy and risky) prediction, approximation of complex engineering analyses, convex quadratic programming and choices of loss functions, etc. The learning based models described herein may be further configured as described in this paper.

In a further embodiment, the model is a neural network. For example, the model may be a deep neural network with a set of weights that model the world according to the data that it has been fed to train it. Neural networks can be generally defined as a computational approach which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and excel in areas where the solution or feature detection is difficult to express in a traditional computer program.

Neural networks typically consist of multiple layers, and the signal path traverses from front to back. The goal of the neural network is to solve problems in the same way that the human brain would, although several neural networks are much more abstract. Modern neural network projects typically work with a few thousand to a few million neural units and millions of connections. The neural network may have any suitable architecture and/or configuration known in the art.

In another embodiment, the model is a convolution neural network (CNN). For example, the embodiments described herein can take advantage of deep learning concepts such as a CNN to solve the normally intractable representation conversion problem (e.g., rendering). The model may have any CNN configuration or architecture known in the art. The CNN may also be configured as described in U.S. patent application Ser. No. 15/353,210 by Bhaskar et al. filed Nov. 16, 2016, which is incorporated by reference as if fully set forth herein. The learning based models described herein may be further configured as described in this patent application.

A recurrent neural network (RNN) is a class of artificial neural networks where connections between units form a directed cycle. This creates an internal state of the network which allows it to exhibit dynamic temporal behavior. Unlike feedforward neural networks, RNNs can use their internal memory to process arbitrary sequences of inputs. This makes them applicable to tasks such as unsegmented connected handwriting recognition or speech recognition.

In a further embodiment, the learning based model includes a parametric or non-parametric Bayesian approach. For example, a learning transformation under fixed imaging or process parameters can be solved by a parametric and non-parametric Bayesian approach, As described in "Bayesian Nonparametric Models," by Orbanz et al., 2010, 14 pages, which is incorporated by reference as if fully set forth herein, a Bayesian nonparametric model is a Bayesian model on an infinite-dimensional parameter space. The parameter space is typically chosen as the set of all possible solutions for a given learning problem. For example, in a regression problem, the parameter space can be the set of continuous functions, and in a density estimation problem, the space can consist of all densities. A Bayesian nonparametric model uses only a finite subset of the available parameter dimensions to explain a finite sample of observations, with the set of dimensions chosen depending on the sample, such that the effective complexity of the model (as measured by the number of dimensions used) adapts to the data. Classical adaptive problems, such as nonparametric estimation and model selection, can thus be formulated as Bayesian inference problems. Popular examples of Bayesian nonparametric models include Gaussian process regression, in which the correlation structure is refined with growing sample size, and Dirichlet process mixture models for clustering, which adapt the number of clusters to the complexity of the data. Bayesian nonparametric models have recently been applied to a variety of machine learning problems, including regression, classification, clustering, latent variable modeling, sequential modeling, image segmentation, source separation and grammar induction.

Nonparametric models constitute an approach to model selection and adaptation, where the sizes of models are allowed to grow with data size. This is as opposed to parametric models which use a fixed number of parameters. For example, a parametric approach to density estimation would be to fit a Gaussian or a mixture of a fixed number of Gaussians by maximum likelihood. A nonparametric approach would be a Parzen window estimator, which centers a Gaussian at each observation (and hence uses one mean parameter per observation). Another example is the support vector machine with a Gaussian kernel. The representer theorem shows that the decision function is a linear combination of Gaussian radial basis functions centered at every input vector, and thus has a complexity that grows with more observations. Nonparametric methods have long been popular in classical (non-Bayesian) statistics. They often perform impressively in applications and, though theoretical results for such models are typically harder to prove than for parametric models, appealing theoretical properties have been established for a wide range of models.

In one such embodiment, likelihood probability is modeled for the parametric or non-parametric Bayesian approach by a Gaussian Mixture Model, a Dirichlet Mixture Model, a Gaussian process, or a deep Gaussian process. In another such embodiment, prior and posterior are modeled for the parametric or non-parametric Bayesian approach by a variational inference or a Markov Chain Monte Carlo.

In Bayesian statistics, the posterior probability of a random event or an uncertain proposition is the conditional probability that is assigned after the relevant evidence or background is taken into account. Similarly, the posterior probability distribution is the probability distribution of an unknown quantity, treated as a random variable, conditional on the evidence obtained from an experiment or survey. "Posterior", in this context, means after taking into account the relevant evidence related to the particular case being examined. The posterior probability is the probability of the parameters $\theta$ given the evidence $X: p(\theta|X)$. It contrasts with the likelihood function, which is the probability of the evidence given the parameters: $p(X|\theta)$. The two are related as follows: Let us have a prior belief that the probability distribution function is $p(\theta)$ and observations x with the likelihood $p(x|\theta)$, then the posterior probability is defined as Posterior probability $\alpha$ Likelihood×Prior probability.

A Gaussian Mixture Model (GMM) is a parametric probability density function represented as a weighted sum of Gaussian component densities. GMMs are commonly used as a parametric model of the probability distribution of continuous measurements or features in a biometric system, such as vocal-tract related spectral features in a speaker recognition system. GMM parameters are estimated from training data using the iterative Expectation-Maximization (EM) algorithm or Maximum A Posteriori (MAP) estimation from a well-trained prior model.

As described in "Variational Inference for Dirichlet Process Mixtures," by Blei et al, Bayesian Analysis (2006), No. 1, pp. 121-144, which is incorporated by reference as if fully set forth herein, the methodology of Monte Carlo Markov chain (MCMC) sampling has energized Bayesian statistics for more than a decade, providing a systematic approach to the computation of likelihoods and posterior distributions, and permitting the deployment of Bayesian methods in a rapidly growing number of applied problems. However, while an unquestioned success story, MCMC is not an unqualified one—MCMC methods can be slow to converge and their convergence can be difficult to diagnose. While further research on sampling is needed, it is also important to explore alternatives, particularly in the context of large-scale problems.

One such class of alternatives is provided by variational inference methods. Like MCMC, variational inference methods have their roots in statistical physics, and, in contradistinction to MCMC methods, they are deterministic. The basic idea of variational inference is to formulate the computation of a marginal or conditional probability in terms of an optimization problem. This (generally intractable) problem is then "relaxed," yielding a simplified optimization problem that depends on a number of free parameters, known as variational parameters. Solving for the variational parameters gives an approximation to the marginal or conditional probabilities of interest.

Variational inference methods have been developed principally in the context of the exponential family, where the convexity properties of the natural parameter space and the cumulant function yield an elegant general variational formalism. For example, variational methods have been developed for parametric hierarchical Bayesian models based on general exponential family specifications. MCMC methods have seen much wider application. In particular, the development of MCMC algorithms for nonparametric models such as the Dirichlet process has led to increased interest in nonparametric Bayesian methods. This gap can be closed by developing variational methods for Dirichlet process mixtures.

The Dirichlet process (D)P) is a measure on measures. The DP is parameterized by a base distribution $G_0$ and a positive scaling parameter $\alpha$. Suppose we draw a random measure G from a Dirichlet process, and independently draw N random variables in from G:

$$G|\{G_0, \alpha\} \sim DP(G_0, \alpha) \; \eta_n \sim G, n \in \{1, \ldots, N\}.$$

Marginalizing out the random measure G, the joint distribution of $\{\eta_1, \ldots, \eta_N\}$ follows a P'olya urn scheme. Positive probability is assigned to configurations in which different $\eta_n$ take on identical values; moreover, the underlying random measure G is discrete with probability one. This is seen most directly in the stick-breaking representation of the DP, in which G is represented explicitly as an infinite sum of atomic measures.

The Dirichlet process mixture model adds a level to the hierarchy by treating $\eta_n$ as the parameter of the distribution of the nth observation. Given the discreteness of G, the DP mixture has an interpretation as a mixture model with an unbounded number of mixture components.

Given a sample $\{x_1, \ldots, x_N\}$ from a DP mixture, the goal is to compute the predictive density: $p(x|x_1, \ldots, x_N, \alpha, G_0) = \int p(x|\eta) p(\eta|x_1, \ldots, x_N, \alpha, G_0) d\eta$. As in many hierarchical Bayesian models, the posterior distribution $p(\eta|x_1, \ldots, x_N, G_0, \alpha)$ is complicated and is not available in a closed form. MCMC provides one class of approximations for this posterior and the predictive density.

With respect to a Gaussian process, as set forth in "Gaussian Processes for Machine Learning," (Chapter 5) by Rasmussen et at., the MUT Press, 2006, pp. 105-128, which is incorporated by reference as if fully set forth herein, Bayesian principles provide a persuasive and consistent framework for inference. Unfortunately, for most interesting models for machine learning, the required computations (integrals over parameter space) are analytically intractable, and good approximations are not easily derived. Gaussian process regression models with Gaussian noise are a rare exception: integrals over the parameters are analytically tractable and at the same time the models are very flexible. The general Bayesian inference principles may be applied to the specific Gaussian process model, in the simplified form where hyperparameters are optimized over. The expressions for the marginal likelihood may be derived and interpreted.

Since a Gaussian process model is a non-parametric model, it may not be immediately obvious what the parameters of the model are. Generally, one may regard the noise-free latent function values at the training inputs f as the parameters. The more training cases there are, the more parameters. Using the weight-space view, one may equivalently think of the parameters as being the weights of the linear model which uses the basis-functions φ, which can be chosen as the eigenfunctions of the covariance function. Of course, this view is inconvenient or nondegenerate covariance functions, since these would then have an infinite number of weights. The learning based models of the embodiments described herein may be further configured as described in the above reference by Rasmussen.

With respect to a Deep Gaussian process, as set forth in "Deep Gaussian Processes," by :Datnianou et al., Proceedings of the International Conference on Artificial Intelligence and Statistics (AISTATS), 2013, 9 pages, which is incorporated by reference as if fully set forth herein, deep Gaussian process (GP) models are deep belief networks based on Gaussian process mappings. The data is modeled as the output of a multivariate GP. The inputs to that Gaussian process are then governed by another GP. A single layer model is equivalent to a standard GP or the GP latent variable model (GP-LVM). Inference in the model may be performed by approximate variational marginalization. This results in a strict lower bound on the marginal likelihood of the model which can be used for model selection (number of layers and nodes per layer). Deep belief networks are typically applied to relatively large data sets using stochastic gradient descent for optimization. A fully Bayesian treatment allows for the application of deep models even when data is scarce. Model selection by variational bound shows that a five layer hierarchy is justified even when modelling a digit data set containing only 150 examples. The learning based models of the embodiments described herein may be further configured as described in the above incorporated reference by Damianou et al.

In some embodiments, the learning based model includes a generative model. A "generative" model can be generally defined as a model that is probabilistic in nature. In other words, a "generative" model is not one that performs forward simulation or rule-based approaches and, as such, a model of the physics of the processes involved in generating an actual image (for which a simulated image is being generated) is not necessary. Instead, as described further herein, the generative model can be learned (in that its parameters can be learned) based on a suitable training set of data.

In one such embodiment, the generative model includes an autoencoder variant, a generative adversarial network, a conditional generative adversarial network, or a deep generative model. For example, for learning a transformation under fixed imaging or process parameters as described above, the learning based model may be configured for a generative approach using one or more generative models including autoencoder variations, in which the decoder part will eventually be used for representation conversion, a generative adversarial network (GAN), in which the generative part of the GAN may be used for representation conversion, a conditional generative adversarial network (CGAN), in which the generative part of the CGAN may be used for representation conversion, and deep generative models such as those described in U.S. patent application Ser. No. 15/176,139 by Zhang et al, filed Jun. 7, 2016, in which the decoder portion of the generative models can be used for representation conversion. The embodiments described herein may be further configured as described in this patent application.

An autoencoder, autoassociator or Diabolo network is an artificial neural network used for unsupervised learning of efficient codings. The aim of an autoencoder is to learn a representation (encoding) for a set of data, typically for the purpose of dimensionality reduction. Recently, the autoencoder concept has become more widely used for learning generative models of data. Architecturally, the simplest form of an autoencoder is a feedforward, non-recurrent neural network very similar to the multilayer perceptron (MLP)— having an input layer, an output layer and one or more hidden layers connecting them—, but with the output layer having the same number of nodes as the input layer, and with the purpose of reconstructing its own inputs (instead of predicting the target value given inputs). Therefore, autoencoders are unsupervised learning models. An autoencoder always consists of two parts, the encoder and the decoder. Various techniques exist, to prevent autoencoders from learning the identity function and to improve their ability to capture important information and learn richer representations. The autoencoder may include any suitable variant of autoencoder such as a Denoising autoencoder, sparse autoencoder, variational autoencoder, and contractive autoencoder.

A GAN included in the embodiments described herein may be configured as described in "Generative Adversarial Nets," Goodfellow et al., arXiv:1406.2661, Jun. 10, 2014, 9 pages, which is incorporated by reference as if fully set forth herein. Goodfellow et al. describe a new framework for estimating generative models via an adversarial process, in which two models are simultaneously trained: a generative model G that captures the data distribution, and a discriminative model D that estimates the probability that a sample came from the training data rather than G. The training procedure for G is to maximize the probability of D making a mistake. This framework corresponds to a minimax two-player game. In the space of arbitrary functions G and D, a unique solution exists, with G recovering the training data distribution and D equal to ½ everywhere. In the case where G and D are defined by multilayer perceptrons, the entire system can be trained with backpropagation. There is no need for any Markov chains or unrolled approximate inference networks during either training or generation of samples. Experiments demonstrate the potential of the framework through qualitative and quantitative evaluation of the generated samples. The learning based models of the embodiments described herein may be further configured as described by Goodfellow et al.

A CGAN included in the embodiments described herein may be configured as described in "Conditional Generative Adversarial Nets," by Mirza et al., arXiv:1411.1784, Nov. 6, 2014, 7 pages, which is incorporated by reference as if fully set forth herein. Generative adversarial nets can be extended to a conditional model if both the generator and discriminator are conditioned on some extra information y. y could be any kind of auxiliary information such as class labels or data from other modalities. Conditioning can be performed by feeding y into both the discriminator and generator as an additional input layer. In the generator, the prior input noise $p_z(z)$, and y are combined in joint hidden representation and the adversarial training framework allows for considerable flexibility in how this hidden representation is composed. In the discriminator x and y are presented as inputs to a discriminative function (embodied in some cases by a MLP). The objective function of a two-player minimax game would then be:

$$\min_G \max_D V(D, G) = E_{x \sim p_{data}(x)}[\log D(x|y)] + E_{z \sim p_z(z)}[\log(1 - D(G(z|y)))].$$

The learning based models included in the embodiments described herein may be further configured as described in the above incorporated reference by Mirza et al.

A deep generative model may be configured to have a deep learning architecture in that the model may include multiple layers, which perform a number of algorithms or transformations. The number of layers on the encoder side of the generative model is use case dependent. In addition, the number of layers on the decoder side is use case dependent and may be dependent on the number of layers on the encoder side. In general, the number of layers on one or both sides of the generative model is not significant and is use case dependent. For practical purposes, a suitable range of layers on both sides is from 2 layers to a few tens of layers.

The embodiments described herein may or may not be configured for training the learning based model. For example, another method and/or system may be configured to generate a trained learning based model, which can then be accessed and used by the embodiments described herein. In a general training procedure, a training dataset of a tuple of (input, expected output) may be collected based on the use case. The training dataset may be used to train the chosen model. During runtime, the input data may be collected (e.g., under the selected imaging and/or process parameters). The prediction may then be performed using the trained model on the input data.

In another embodiment, the one or more computer subsystems are configured for training the learning based model using a conditional generative adversarial network (CLAN). For example, the embodiments described herein may be configured for learning transformation with one or more imaging or process parameters via a CGAN. For example, in a CGAN, which may be configured as described further herein, a generative model, G, may be followed by a discriminative model, D. During training, the input (which can be denoted herein as I(x, y, ...)) to the CGAN may include one or more of a stack of optical images (e.g., O(x, y, ...)), a stack of electron beam images (e.g. S(x, y, ...)), and a design stack (e.g., D(x, y, ...)).

In one such embodiment, the training includes inputting a noise prior to a generative portion of the CGAN. For example, the input described above may be input to the generative model, G, possibly with noise z~P(z) and/or process or imaging parameters. The input noise may be random noise, z, drawn from a chosen distribution, e.g., Gaussian. The noise input may have the same width and height as I(x, y, ...). The input parameters may be a parameters map generated from process or imaging parameters. The parameters map may have the same width and height as the input.

The generative model may generate "fake" images (e.g., F(x, y, ...)) or whatever simulated output the learning based model will be used to generate for specimens. The "fake" images may be input to the discriminative model, D. The discriminative model may be configured to use the "fake" images and "real" images (e.g., R(x, y, ...)) to determine how well the generative model is performing. In this manner, the generative part, G, of the CGAN may learn how to predict the expected "output" described herein. The generated "fake" images are input to the discriminative part, D, which tries to distinguish the "fake" generated images from the real images. The loss function is:

$$\min_{\theta_G} \max_{\theta_D} E_I[\log D(I, p)] + E_z[\log(1 - D(G(z, I, P), p))].$$

By training the D and G together, G is expected to learn the transformation well.

The parameters map may be an input of the desired imaging or process parameters for which simulated output will be generated by the embodiments described herein. The parameters map may be generated in two ways. For example, in a first approach, a 1×1 matrix for each parameter may be constructed. Then, constant up-pooling may be performed to produce the parameters map. In a second approach, the 1×1 matrix for each parameter may be generated, which may be input to several stages of convolution, nonlinear and up-pooling operations. Each stage of convolution, non-linear, and up-pooling may be also referred to as a deconvolutional layer, During training, then, the procedure may be as follows. A training dataset may be collected on a tuple of (input, expected output) based on the use case. If the parameter range of output images is continuous, the possible choices of an imaging or process parameter is essentially infinite. As a common practice, a few values can be sampled from the parameter range, and the data may be collected based on the sampled values. The training dataset may then be used to train the CGAN, During runtime, the procedure may be as follows. The input data may be collected under given imaging and/or process parameters. A prediction may then be performed using the trained model based on the input data.

Training the learning based model may be further performed as described in U.S. patent application Ser. No. 15/176,139 by Zhang et al. filed Jun. 7, 2016, and Ser. No. 15/394,790 by Bhaskar et al. filed Dec. 29, 2016, which are incorporated by reference as if fully set forth herein. The embodiments described herein may be further configured as described in these patent applications. The training datasets used to train the learning based models described herein may also be augmented and/or sampled for richness purposes. For example, the training dataset may be created to include or may be augmented with synthetic training data, which may be generated and used for training as described in U.S. patent application Ser. No. 15/394,790 by Bhaskar et al. filed Dec. 29, 2016, which is incorporated by reference as if fully set forth herein. The embodiments described herein may be further configured as described in this patent application.

The model described herein may be generated for specific specimens g., specific wafers or reticles), processes, and imaging parameters. In other words, the models described herein may be specimen specific, process specific, and imaging parameter specific. For example, in one embodiment, each model may be trained to be specific to a particular design and wafer layer. The trained model will then only be used to perform predictions for that layer. In this manner, different models may be generated for different wafer layers. However, in another embodiment, a single model may be trained with data from different designs and wafer type layers. The resulting model may he used to perform predictions in general for all types of the specimens included in the training data. In addition, different models may be generated for different sets of imaging parameters (e.g., different imaging modes). In general, a model may be independent of tool as long as the selected imaging modes are repeatable across the tools. Each of the different models may be generated with different training sets of data. Each of the different training sets of data may be generated in any suitable manner.

In another embodiment, the embodiments described herein may include aligning one or more of optical images, electron beam images, and design to each other. For example, since the embodiments described herein perform transformations between optical, electron beam, and design, the simulated output will be essentially mapped to the input. Therefore, the input and output are essentially and inherently aligned to each other. The input that corresponds to the simulated output at any given x, y location can then be determined in a substantially straightforward manner (based on common x, y coordinates). In this manner, the simulated output that corresponds to different portions of the input may be identified in a substantially easy manner and used to perform one or more functions with or on the input. For example, based on the simulated output and its correspondence to the input, one or more parameters used for defect detection may be altered as a function of the x, y positions. In another example, if the input and/or simulated output are used to alter one or more parameters of a process performed on the specimen, the one or more parameters may be altered based on the characteristics of the input and/or simulated output as function of x, y positions.

The embodiments described herein can also be used to provide substantially realistic samples for supervised training. For example, the simulated output and its corresponding input may be used for supervised training of one or more different learning based models, which may include any of the learning based models described herein or any other suitable learning based models known in the art. The supervised training may be performed in any suitable manner using the simulated output and its corresponding input generated as described further herein.

In another embodiment, the embodiments described herein may be used to generate a reference image for defect detection (e.g., die-to-database inspection). For example, the embodiments described herein may be configured for generating a reference image from one or more of the inputs described herein (e.g., design, electron beam images(s), optical image(s)), and the generated reference may be compared to output generated by directing energy (e.g., light or electrons) to a specimen and detecting energy (e.g., light or electrons) from the specimen. The differences between the generated reference and the output may then be used to detect defects on the specimen (e.g., by comparing the differences to a threshold and identifying differences above the threshold as corresponding to defects on the specimen).

The embodiments described herein may be configured for generating substantially high quality (e.g., high resolution) defect review images (e,g., SEM review images) from relatively low quality (e.g., low resolution)) images (e.g., SEM or optical inspection images) as described in U.S. patent application Ser. No. 15/396,800 filed by Zhang et al. on Jan. 2, 2017, which is incorporated by reference as if fully set forth herein. The embodiments described herein may be further configured as described in this patent application.

In some embodiments, the one or more computer subsystems are configured for verifying a defect detected in the one or more low resolution images, and the verifying is performed using the high resolution image. For example, one benefit of the optical image to SEM and/or design transformations described herein is that optical inspection is still the key for high volume production yield in semiconductor manufacturing processes. Due to lack of resolution, defects detected by optical inspectors require SEM review for defect verification. Methods that automatically transform optical to SEM and/or design can potentially reduce SEM review requirements for yield management, thereby reducing total inspection cycle time. For example, the embodiments described herein can eliminate the need for acquiring SEM images on a defect review system after specimen inspection since the high resolution image(s) described herein can be 1) acquired without the specimen and without imaging hardware and 2) used for defect review applications such as defect verification.

In another embodiment, the one or more computer subsystems are configured for classifying a defect detected in the one or more low resolution images, and the classifying is performed using the high resolution image. For example, as described above, one benefit of the optical image to SEM and/or design transformations described herein is that optical inspection is still the key for high volume production yield in semiconductor manufacturing processes. Due to lack of resolution, defects detected by optical inspectors require SEM review for defect classification. Methods that automatically transform optical to SEM and/or design can potentially reduce SEM review requirements for yield management, thereby reducing total inspection cycle time. For example, the embodiments described herein can eliminate the need for acquiring SEM images on a defect review system after specimen inspection since the high resolution image(s) described herein can be 1) acquired without the specimen and without imaging hardware and 2) used for defect review applications such as defect classification.

In a further embodiment, the one or more computer subsystems are configured for detecting defects on the specimen based on a combination of the one or more low resolution images and the high resolution image. For example, one benefit of the optical to SEM and optical to design transformations described herein is that these transformations allow the optical inspector to use the high resolution spatial content for nuisance/defect discrimination across the entire die. In contrast, currently used methods of using spatial information for nuisance/defect discrimination is limited to the hot spot use case. In particular, currently used methods are limited to the hot spot use case primarily due to the fact that the optical defect signals do not have enough saliency against the background noise. Inspecting only pixels that qualify as hot spots allows the system to automatically filter out the majority of pixels on the wafer based on spatial information. Doing so enhances the defect saliency and ultimately improves defect detection. To do so, the system requires someone or a method to identify the important spatial locations for inspection. These locations are then marked as "hot spots" (i.e., the action of identifying spatial location of the inspector turns these locations into "hot spots").

The computer subsystem(s) may be configured to use the combination of one or more low resolution images and one or more high resolution images to detect defects on the specimen in any suitable manner. For example, a position of a defect detected in a low resolution image may be identified in a high resolution image to determine the design context of the defect, which can then be used to determine if the defect is a nuisance defect or an actual defect. In addition, a position of a defect detected in a low resolution image may be used to identify the position of the defect in a high resolution image to determine if the defect is present (can be detected) in the high resolution image. If the defect can be detected in the high resolution image, it is designated as an actual defect. If the defect cannot be detected in the high resolution image, it is designated as a nuisance defect.

The embodiments described herein have a number of advantages. For example, the embodiments described herein establish the triangular relationship between optical images, electron beam images, and design. In contrast, currently no automated system exists that attempts to map the triangular relationship between optical, electron beam, and design. The embodiments described herein may also be configured to perform transformation from any subset of representations to another subset of representations within the resolution limit. For example, the transformations may include optical to electron beam, optical to design, and electron beam to design. In addition, the embodiments described herein may be configured for learning the transformations as a function of imaging and process parameters. For example, optical images may be simulated under different process focus and exposure with one model instead of several models, each of which is for a fixed set of parameters. The embodiments described herein also do not require an explicit model. For example, unlike forward simulation or rule-based approaches, there is no requirement on a predefined (physical or heuristic) model, which is extremely difficult to be understood from first principle physics or to he approximated well. The embodiments described herein eliminate this requirement by learning an implicit model via a learning based model. Furthermore, the embodiments described herein can generate simulated output that is substantially robust to color noise. For example, a deep network such as a GAN and a CGAN can be trained to be robust against color noise. Moreover, the embodiments described herein provide substantially fast speeds in production runtimes (i.e., can do relatively quick predictions).

Each of the embodiments of each of the systems described above may be combined together into one single embodiment.

Another embodiment relates to a computer-implemented method for generating simulated output for a specimen. The method includes acquiring information for a specimen with one or more computer systems. The information includes at least one of an actual optical image of the specimen, an actual electron beam image of the specimen, and design data for the specimen. The method also includes inputting information for the specimen into a learning based model. The learning based model is included in one or more components executed by the one or more computer systems. The learning based model is configured for mapping a triangular relationship between optical images, electron beam images, and design data, and the learning based model applies the triangular relationship to the input to thereby generate simulated output for the specimen.

Each of the steps of the method may be performed as described further herein. The method may also include any other step(s) that can be performed by the system, computer system(s), optical or electron beam tools, component(s), model(s), etc. described herein. The one or more computer systems, the one or more components, and the model may be configured according to any of the embodiments described herein, e.g., computer subsystem(s) 102, component(s) 100, and model 104. In addition, the method described above may be performed by any of the system embodiments described herein.

Figure 3:
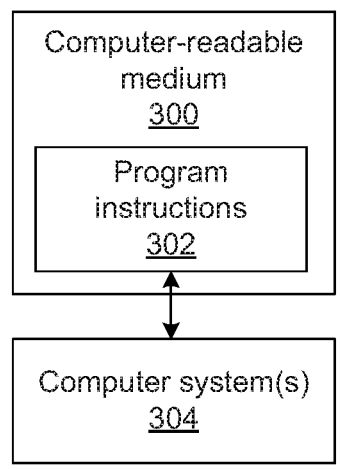
FIG. 3 is a block diagram illustrating one embodiment of a non-transitory computer-readable medium storing program instructions for causing one or more computer systems to perform a computer-implemented method described herein.

An additional embodiment relates to a non-transitory computer-readable medium storing program instructions executable on one or more computer systems for performing a computer-implemented method for generating simulated output for a specimen. One such embodiment is shown in FIG. 3. In particular, as shown in FIG. 3, non-transitory computer-readable medium 300 includes program instructions 302 executable on computer system(s) 304. The computer-implemented method may include any step(s) of any method(s) described herein.

Program instructions 302 implementing methods such as those described herein may be stored on computer-readable medium 300. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMI) Extension) or other technologies or methodologies, as desired.

Computer system(s, 304 may be configured according to any of the embodiments described herein.

Further modifications and alternative embodiments of various aspects of the invention will be apparent to those skilled in the art in view of this description. For example, methods and systems for generating simulated output for a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to generate simulated output for a specimen, comprising:
   one or more computer subsystems configured for acquiring information for a specimen, wherein the information comprises at least one of an actual optical image of the specimen, an actual electron beam image of the specimen, and design data for the specimen; and
   one or more components executed by the one or more computer subsystems, wherein the one or more components comprise a learning based model, wherein the learning based model is configured for mapping a triangular relationship between optical images, electron beam images, and design data, wherein the one or more computer subsystems are configured to input the information for the specimen into the learning based model, and wherein the learning based model applies the triangular relationship to the input to thereby generate simulated output for the specimen.

2. The system of claim 1, wherein the information that is input to the learning based model comprises the actual optical image of the specimen, and wherein the simulated output comprises a simulated electron beam image representing an actual electron beam image generated for the specimen by an electron beam tool.

3. The system of claim 1, wherein the information that is input to the learning based model comprises the actual optical image of the specimen, and wherein the simulated output comprises simulated design data for the specimen.

4. The system of claim 1, wherein the information that is input to the learning based model comprises the actual electron beam image of the specimen, and wherein the simulated output comprises simulated design data for the specimen.

5. The system of claim 1, wherein the information for the specimen further comprises actual optical images of the specimen generated at different values of a parameter of an optical tool, wherein the information that is input to the learning based model comprises the actual optical images of the specimen, and wherein the simulated output comprises a simulated electron beam image of the specimen representing an actual electron beam image generated for the specimen by an electron beam tool.

6. The system of claim 1, wherein the information for the specimen further comprises actual optical images of the specimen generated at different values of a parameter of an optical tool, wherein the information that is input to the learning based model comprises the actual optical images of the specimen, wherein the input to the learning based model further comprises another different value of the parameter of the optical tool, and wherein the simulated output comprises a simulated optical image of the specimen representing an optical image generated at the other different value of the parameter of the optical tool.

7. The system of claim 1, wherein the information that is input to the learning based model comprises the actual optical image of the specimen and the design data for the specimen, and wherein the simulated output comprises a simulated electron beam image for the specimen representing an actual electron beam image generated for the specimen by an electron beam tool.

8. The system of claim 1, wherein the information for the specimen further comprises actual optical images of the specimen corresponding to different values of a parameter of a process performed on the specimen, wherein the information that is input to the learning based model comprises the actual optical images of the specimen, wherein the input to the learning based model further comprises another different value of the parameter of the process, and wherein the simulated output comprises a simulated optical image of the specimen corresponding to the other different value of the parameter of the process.

9. The system of claim 1, wherein the information for the specimen further comprises actual optical images of the specimen generated at different values of a parameter of an optical tool, wherein the information that is input to the learning based model comprises the actual optical images of the specimen and the design data for the specimen, and wherein the simulated output comprises defect classifications for defects detected on the specimen.

10. The system of claim 1, wherein the information that is input to the learning based model comprises run time input, and wherein the information for the run time input comprises information for a pattern not included in input to the learning based model used for training the learning based model.

11. The system of claim 1, wherein the learning based model is not configured for generating the simulated output for the specimen by performing pixel-value interpolation.

12. The system of claim 1, wherein the learning based model is not configured for generating the simulated output for the specimen by performing pixel-value extrapolation.

13. The system of claim 1, wherein the learning based model is further configured for mapping a relationship between patterned features on the specimen and one or more of the optical images, the electron beam images, and the design data.

14. The system of claim 1, wherein the information for the specimen further comprises two or more actual optical images of the specimen, and Wherein the two or more actual optical images comprise two or more actual optical images corresponding to different values of a parameter of an optical tool, two or more actual optical images of a layer on the specimen generated before and after a process is performed on the specimen, two or more actual optical images of different physical layers on the specimen, two or more actual optical images of the specimen generated by different optical tools, two or more actual optical images of the specimen corresponding to different values of a parameter of a process performed on the specimen, or a combination thereof.

15. The system of claim 1, wherein the information for the specimen further comprises two or more actual electron beam images of the specimen, and wherein the two or more actual electron beam images comprise two or more actual electron beam images corresponding to different values of a parameter of an electron beam tool, two or more actual electron beam images of a layer on the specimen generated before and after a process is performed on the specimen, two or more actual electron beam images of different physical layers on the specimen, two or more actual electron beam images of the specimen generated by different electron beam tools, two or more actual electron beam images of the specimen corresponding to different values of a parameter of a process performed on the specimen, or a combination thereof.

16. The system of claim 1, wherein the design data for the specimen comprises the design data stacked by: different selected patterns in the same layer, different layers, different materials, or a combination thereof.

17. The system of claim 1, wherein the information for the specimen further comprises information for patterned features formed on the specimen, and wherein the information for the patterned features is generated experimentally or theoretically.

18. The system of claim 1, wherein the learning based model comprises a discriminative model.

19. The system of claim 18, wherein the discriminative model comprises a support vector machine, a support vector regression, a convolutional neural network, or a recurrent neural network.

20. The system of claim 1, wherein the learning based model comprises a parametric or non-parametric Bayesian approach.

21. The system of claim 20, wherein likelihood probability is modeled for the parametric or non-parametric Bayesian approach by a Gaussian Mixture Model, a Dirichlet Mixture Model, a Gaussian process, or a deep Gaussian process.

22. The system of claim 20, wherein prior and posterior are modeled for the parametric or non-parametric Bayesian approach by a variational inference or a Markov Chain Monte Carlo.

23. The system of claim 1, wherein the learning based model comprises a generative model.

24. The system of claim 23, wherein the generative model comprises an autoencoder variant, a generative adversarial network, a conditional generative adversarial network, or a deep generative model.

25. The system of claim 1, wherein the one or more computer subsystems are configured for training the learning based model using a conditional generative adversarial network.

26. The system of claim 25, wherein the training comprises inputting a noise prior to a generative portion of the conditional generative adversarial network.

27. A non-transitory computer-readable medium, storing program instructions executable on one or more computer systems for performing a computer-implemented method for generating simulated output for a specimen, wherein the computer-implemented method comprises:

acquiring information for a specimen with the one or more computer systems, wherein the information comprises at least one of an actual optical image of the specimen, an actual electron beam image of the specimen, and design data for the specimen; and inputting the information for the specimen into a learning based model, wherein the learning based model is included in one or more components executed by the one or more computer systems, wherein the learning based model is configured for mapping a triangular relationship between optical images, electron beam images, and design data, and wherein the learning based model applies the triangular relationship to the input to thereby generate simulated output for the specimen.

28. A computer-implemented method for generating simulated output for a specimen, comprising:

acquiring information for a specimen with one or more computer systems, wherein the information comprises at least one of an actual optical image of the specimen, an actual electron beam image of the specimen, and design data for the specimen; and inputting the information for the specimen into a learning based model, wherein the learning based model is included in one or more components executed by the one or more computer systems, wherein the learning based model is configured for mapping a triangular relationship between optical images, electron beam images, and design data, and wherein the learning based model applies the triangular relationship to the input to thereby generate simulated output for the specimen.

* * * * *